(12) United States Patent
Chang

(10) Patent No.: US 11,095,067 B2
(45) Date of Patent: Aug. 17, 2021

(54) ELECTRICAL CONNECTOR WITH WATERPROOF STRUCTURE

(71) Applicant: PHIHONG TECHNOLOGY CO., LTD., Taoyuan (TW)

(72) Inventor: Chun Feng Chang, Taoyuan (TW)

(73) Assignee: PHIHONG TECHNOLOGY CO., LTD., Taoyuan (TW)

( * ) Notice: Subject to any disclaimer, the term of this patent is extended or adjusted under 35 U.S.C. 154(b) by 0 days.

(21) Appl. No.: 16/542,323

(22) Filed: Aug. 16, 2019

(65) Prior Publication Data
US 2020/0403353 A1    Dec. 24, 2020

(30) Foreign Application Priority Data

Jun. 21, 2019 (TW) ................ 108121792

(51) Int. Cl.
*H01R 13/52* (2006.01)
*H01R 31/06* (2006.01)
*H05K 5/00* (2006.01)
*H05K 5/06* (2006.01)

(52) U.S. Cl.
CPC ....... *H01R 13/5202* (2013.01); *H01R 31/065* (2013.01); *H05K 5/0069* (2013.01); *H05K 5/068* (2013.01); *H01R 13/5216* (2013.01)

(58) Field of Classification Search
CPC ............ H01R 13/5202; H01R 13/5213; H01R 13/5219; H01R 31/065; H01R 31/06; H01R 12/716; H01R 12/724; H05K 5/068; H05K 5/0069

USPC ........................ 439/76.1, 638, 271
See application file for complete search history.

(56) References Cited

U.S. PATENT DOCUMENTS

| | | | | |
|---|---|---|---|---|
| 8,616,900 B1* | 12/2013 | Lion | ............... | G11B 25/043 |
| | | | | 439/76.1 |
| 8,727,795 B2* | 5/2014 | Feyder | ............. | H01R 12/732 |
| | | | | 439/76.1 |
| 8,801,463 B2* | 8/2014 | Tan | ............. | H01R 13/521 |
| | | | | 439/607.04 |
| 9,444,177 B2* | 9/2016 | Tsai | ............ | H01R 13/5202 |
| 9,627,796 B2* | 4/2017 | Tsai | ............ | H01R 13/5202 |
| 9,728,916 B1* | 8/2017 | Tsai | ............ | H01R 13/5219 |
| 9,768,544 B2* | 9/2017 | Du | ............. | H01R 13/5216 |
| 9,871,318 B2* | 1/2018 | Wang | ............ | H01R 13/516 |
| 10,418,747 B2* | 9/2019 | Zhao | ............ | H01R 13/6581 |
| 2016/0244088 A1* | 8/2016 | Hagiwara | ........ | H05K 5/0004 |
| 2017/0098912 A1* | 4/2017 | Chang | ............ | H01R 24/28 |

* cited by examiner

*Primary Examiner* — Harshad C Patel
(74) *Attorney, Agent, or Firm* — WPAT, PC

(57) ABSTRACT

The present invention provides a connector with waterproof structure and the manufacturing method, comprising: an base, providing the support of components in the connector; housing, enclose the components inside of the connector; the connecting groove, located on the base with slot shape; the connecting unit, mounted on the connecting groove and penetrated out with the base; the first retaining block, disposed between the connecting groove and the outer wall of the housing, separating the upper end of the base into a plurality of waterproof compartments, wherein the waterproof compartment is filled with waterproof glue; and the upper lid, upper lid, sealing the upper end of the base to achieve the purpose of preventing moisture and dust particles from entering the connector.

10 Claims, 6 Drawing Sheets

ELECTRICAL CONNECTOR WITH WATERPROOF STRUCTURE

TECHNICAL FIELD

The present invention relates to an electrical connector with waterproof structure, more particularly, said electrical connector is injected with rubber material into inner space for increasing airtightness, preventing the moisture or suspended particles infiltrate into the electrical connector.

BACKGROUND

Since the wide applications of electrical power to the human civilization, various functional appliances have begun to enter people's lives. Among them, the connectors are installed in various types of electronic devices, which are placed inside the housing of electronic devices for connecting with appliances. The functions of the connectors comprise transmitting the electrical power or electrical signals, for instance, computers, mobile phones, tablet, wearable devices, and detecting instruments commonly used in the business market are equipped with connectors, which specification might be USB, RS 232, DVI, or HDMI, mounting in the socket corresponding to the size and shape of the connectors for coupling to the two electronic devices or electrical power.

In the prior art, the airtightness between the connector and the connecting wire is not enough, resulting to the moisture or suspended particles easily infiltrate or accumulate in the electrical connector. In addition, the existence of the gap at the surface between the male connector and female connector cause the poor effect of water resist, making the connector could only be used in the drying environment, once the connector is exposed to the environment with relatively high humidity, moisture or liquid could easily infiltrate from the gap of the surface to the electrode located inside the connector, causing the short circuit damage or electrical leakage, raising the risk of electric shock. Further, the electrode corrosion resulting from the moisture may lead to the voltage rise instantaneously of the connector, lowering down the lifetime of the connector, even the fire hazard.

Therefore, at present, some manufacturers have introduced a kind of electrical connector such as Taiwan Patent M551776, the prior art '776 discloses an electrical connector with waterproof pad, including insulation body (namely, the housing), conductive structure (including electrode and conductive sheet); waterproof pad (the moisture or liquid could not infiltrate inside because the conductive structure is sealed through the deformation of waterproof pad while it is extruded). The waterproof structure of the prior art '776 mainly relies on the waterproof pad to be deposited on the bottom portion of the electrical connector, therefore, the possible disadvantage is that if the waterproof pad has a large tolerance with the insulation body during the production process, the shape of the waterproof pad may not seal as well as expected; furthermore, if the variation of the ambient temperature is large, or the use time is long, it may gradually lose the elasticity of the waterproof pad, so that the infiltration probability of moisture or suspended particles would be larger, causing the corrosion of the electrode. Thus, at the current time, these is still demand to improve the waterproof structure for achieving the purpose of preventing the moisture or suspended particles from infiltrating into the connector.

SUMMARY

In view of the disadvantages of the prior art, the present invention provides an electrical connector with waterproof structure, comprising: base, providing the support of components in the electrical connector; housing, enclose the base and components inside of the electrical connector; the connecting groove, located on the base with open slot shape, making the base could be penetrated from the upper end and lower end; the connecting unit, mounted on the connecting groove and exposed out of the base; the first retaining block, disposed between the connecting groove and the outer wall of the housing, separating the upper end of the base into a plurality of waterproof compartments, wherein the waterproof compartment is filled with waterproof glue, exhausting the air out of the connector via the extrusion of the waterproof glue between said connecting unit and said base; and, the upper lid, sealing the upper end of the base to achieve the purpose of preventing moisture and suspended particles from entering the electrical connector.

According to the content of the present invention, the electrical connector further comprising the second retaining block, disposed between the connecting groove and the outer wall of the housing, forming a plurality of waterproof compartment arrays with said first retaining block, increasing the density between the waterproof glue and the waterproof compartment for raising the airtightness of said electrical connector.

According to the content of the present invention, the electrical cable is mounted on the connecting unit, which penetrate the inner side of the base through the pore disposed on the base for transmitting the electrical power and electrical signal, wherein the number of the electrical cable might be at least one, and could be configured according to the amount of electrical power or electrical signal.

According to an embodiment of the present invention, the material of the waterproof glue could be, but not limit to Silicone, Epoxy, Polyurethane, Butyl Rubber, Hypalon Polyethylene Rubber, Natural Rubber, Polyacrylate Rubber, Neoprene Rubber, or the combination of the above materials.

According to the content of electrical connector in the present invention, the level of water protection could achieve the standard of IP code form IPX3-IPX9 (International Protection Marking).

According to the content of electrical connector in the present invention, the level of suspended particulate protection could achieve the standard of IP code form IP2X-IP6X (International Protection Marking).

According to the content of the present invention, the spec of the connecting unit could be but not limit to USB (Universal Serial Bus), RS 232, RS 422, RS 423, RS 485, DVI (Digital Visual Interface), HDMI (High Definition Multimedia Interface), PS/2 (Personal System/2), and so on.

The present invention provides a manufacturing method of electrical connector with waterproof structure, comprising: assembling the connecting unit to the connecting groove on a base, wherein the base is provided with the first retaining block and the second retaining block; assembling and fixing one end of electrical cable to the connecting unit, and the other end of said electrical cable penetrated inside the base through the pore mounted on the base; filling the waterproof glue into the waterproof compartment to form the first retaining block and the second retaining block; ultrasonic welding is used to seal the components of the electrical connector, comprising welding the upper lid, the base, the connecting unit, and the housing to prevent the moisture and suspended particles from infiltrating into the electrical connector.

According to an embodiment of the present invention, the material of the waterproof glue could be, but not limit to Silicone, Epoxy, Polyurethane, Butyl Rubber, Hypalon Polyethylene Rubber, Natural Rubber, Polyacrylate Rubber, Neoprene Rubber, or the combination of the above materials.

BRIEF DESCRIPTION OF THE DRAWINGS

The components, characteristics and advantages of the present invention may be understood by the detailed descriptions of the preferred embodiments outlined in the specification and the drawings attached.

DETAILED DESCRIPTION

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

The purpose of the present invention is to provide a connector with waterproof structure for improving the performance of the conventional prior art. First, the waterproof glue is cooling and solidifying naturally after filling to the waterproof compartment, the upper lid is then fixed to the housing by the ultrasonic welding, making the waterproof glue more adhered to the base and cladding the connecting unit inside the waterproof compartment, which may eliminate the opportunity of moisture or suspended particles infiltrate into the electrical connector; in addition, during the progress of coupling the electrical connector and the connecting wire, the internal residual air could be extruded as less as possible, making the pressure at both ends of the electrical connector uniform and reducing the probability of moisture and suspended particles infiltrate into the housing. The construction and implementation way of the present invention would be disclosed detailed below. Finally, the person in the skilled art should know the numbers of the first retaining block and the second retaining block could be mounted, resulting from the needs of the application, which would only illustrate the present invention rather than the limitation.

Figure 1:
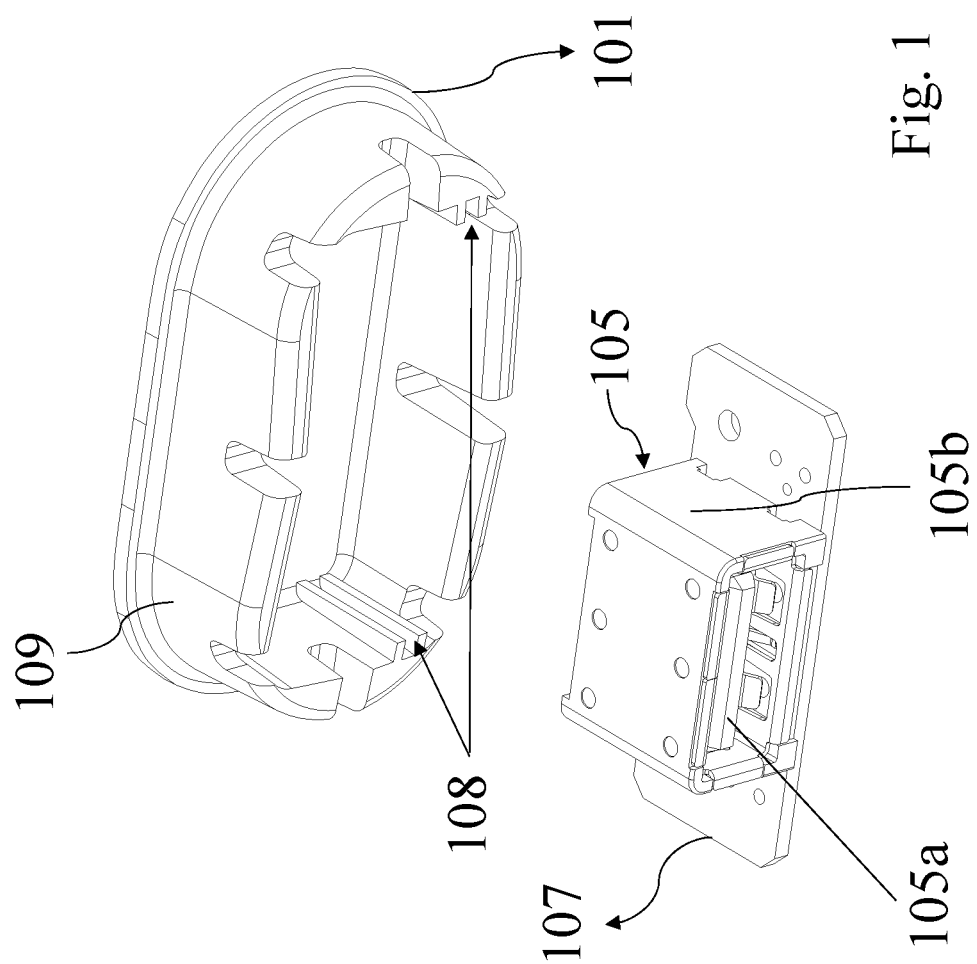
FIG. 1 illustrates the structure of the base and connecting unit.
Figure 2:
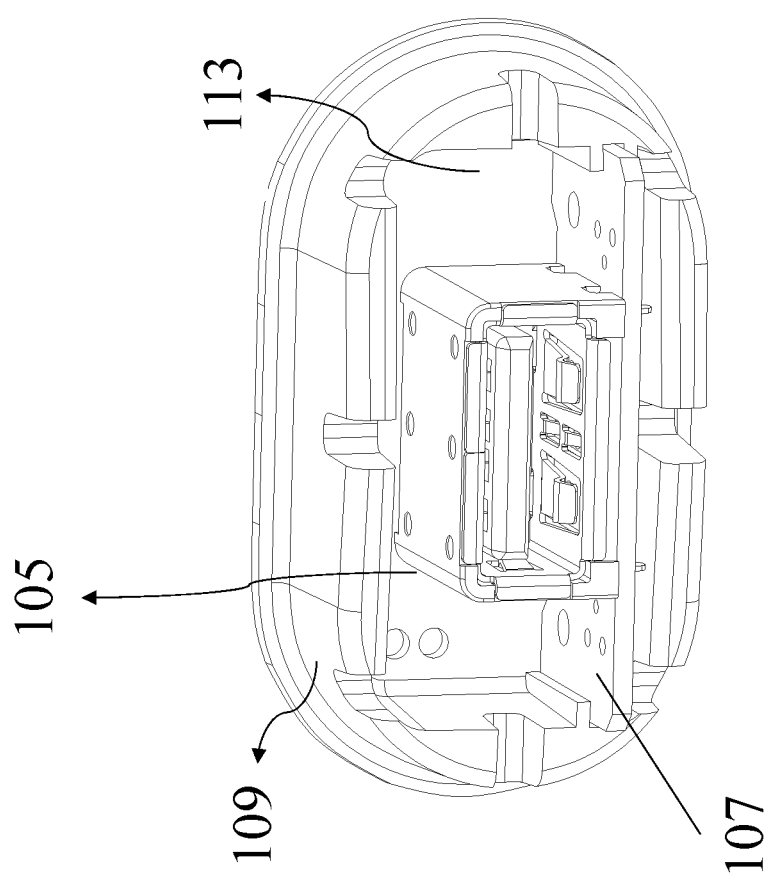
FIG. 2 illustrates the structure of the base and the connecting unit after the assembling with each other.
Figure 3:
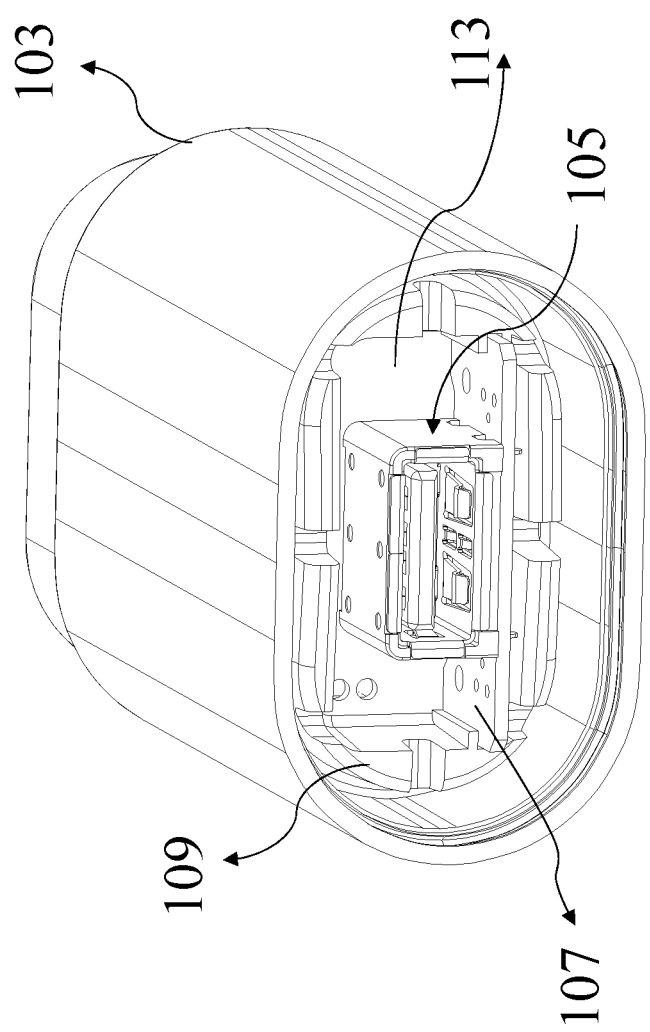
FIG. 3 illustrates the structure of electrical connector comprises the housing.
Figure 4A:
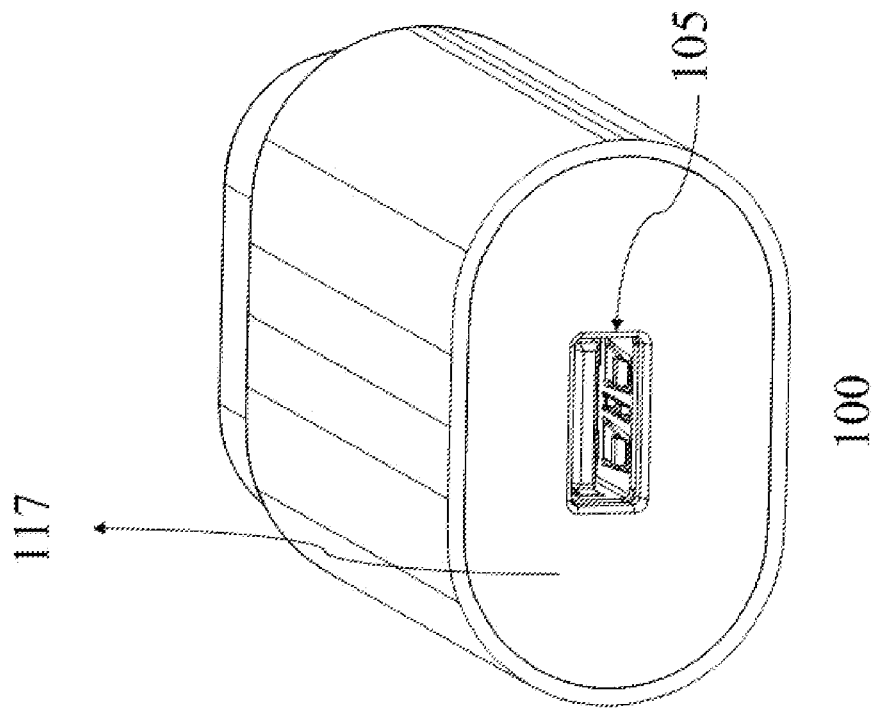
FIG. 4A illustrates the structure after the waterproof glue is filled into the electrical connector.
Figure 4B:
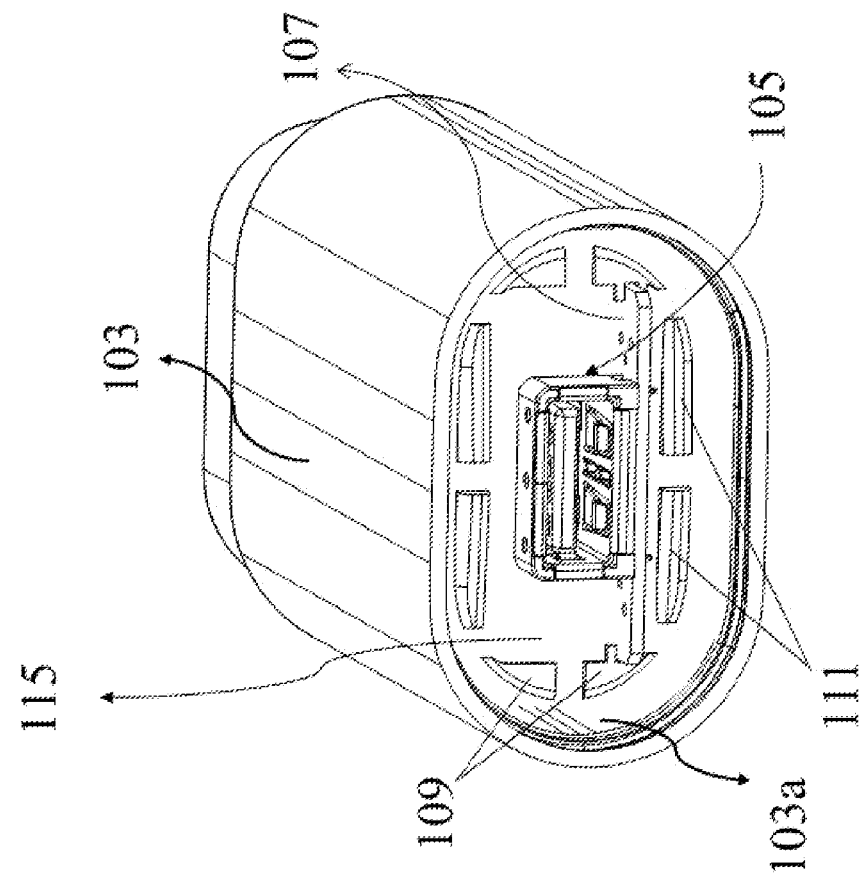
FIG. 4B illustrates the appearance after the upper lid is fixed on the electrical connector.
Figure 5:
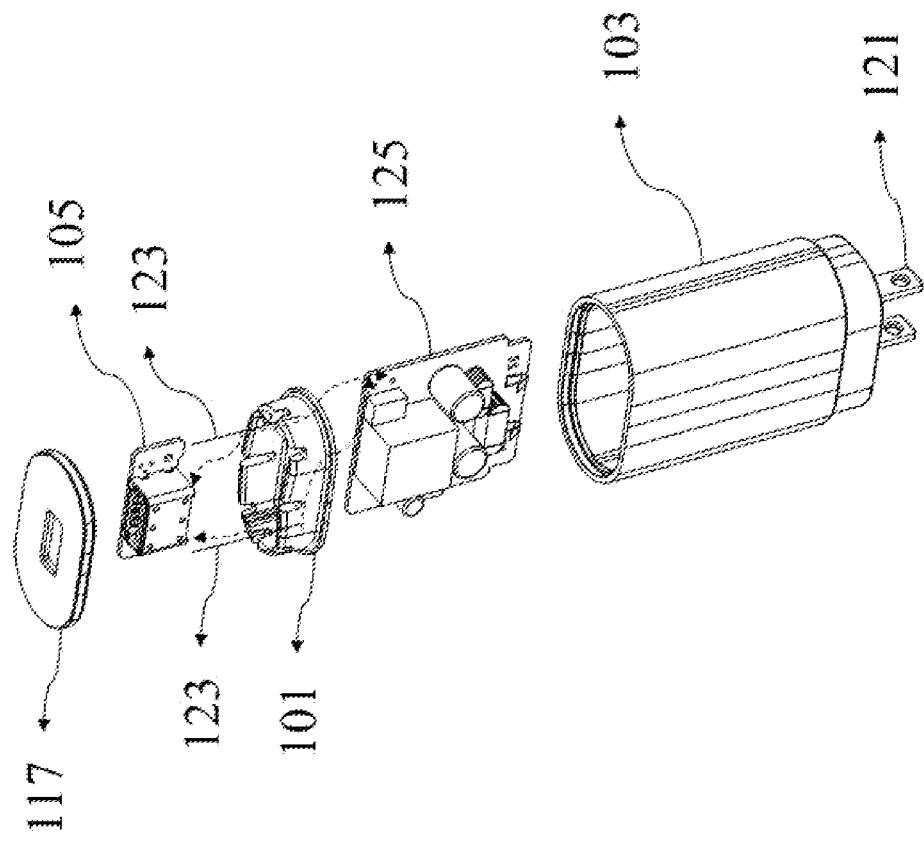
FIG. 5 illustrates the decomposition drawing of the electrical connector with waterproof structure.
Figure 6:
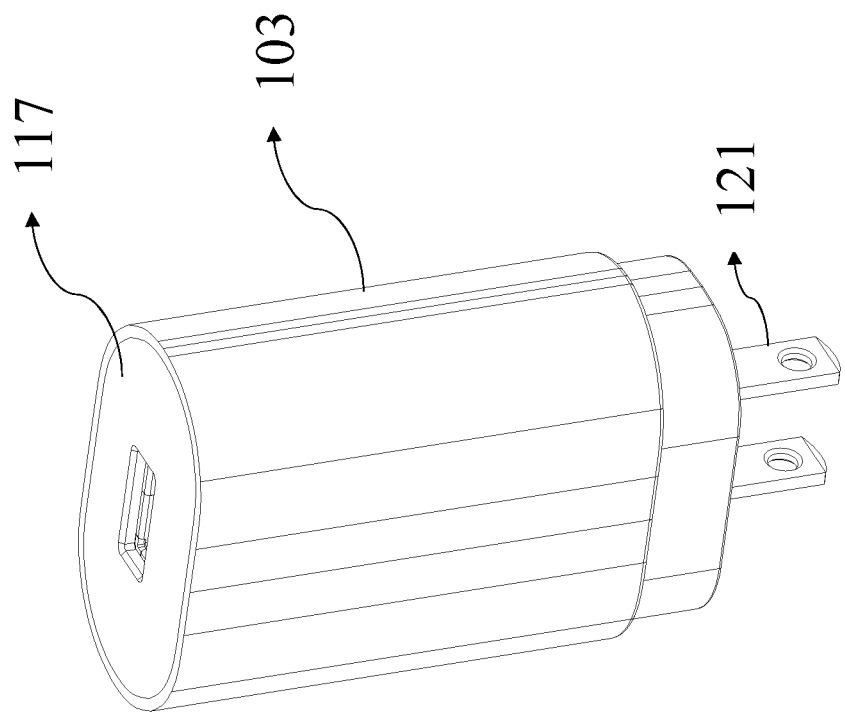
FIG. 6 illustrates the appearance of the electrical connector with waterproof structure in one embodiment of the present invention.

In accordance with the purpose mentioned above, please refer to the FIG. 1-FIG. 3, the present invention proposes an electrical connector 100 with waterproof structure, comprising: a base 101, providing the support of components in the electrical connector 100; a housing 103, enclosed the base 101 and components inside of the electrical connector 100; the a connecting receptacle 105 having a tong portion 105a enclosed by an outer casing 105b mounted on a connecting unit 107, which can be installed on the base 101 through a pair of guiding slots 108 a first retaining block 109 extending from the base 101 to form an enclosed shape and disposed between the connecting receptacle 105 and the inner wall of the housing 103, space of the upper end of the base 101 that is tightly fit with the housing 103 being partitioned into a plurality of waterproof compartments 113 by the first retaining block 109 and the connecting receptacle 105, wherein the plurality of waterproof compartments 113 are filled with waterproof glue 115 to exhaust air out of the electrical connector 100 via the extrusion of the waterproof glue 115 inside the plurality of waterproof compartments 113 for preventing moisture and particles from entering to the other side of the base, which can have electrical components installed (please refer to FIG. 5). As shown in FIG. 4, the space between the connecting receptacle 105 and said housing 103 is sealed by an upper lid 117 for preventing moisture and suspended particles from entering the electrical connector 100.

According to the content of the present invention, the quantity of the waterproof glue 115 filled into the waterproof compartment 113, is 60% height between the edge forming on the base 101 of the housing 103 and the base 101, which could be lightweight the electrical connector 100 and optimize the effectiveness of waterproof and dust-proof. Also, the deposition of the base 101 could also reduce the nonessential weight, improving the conventional waterproof glue 115, so that electrical connector 100 of the present invention has a lighter weight structure.

According to the content of the present invention, please refer to the FIG. 4A, the electrical connector 100 further comprising the second retaining block 111, disposed between the connecting receptacle 105 and the outer wall of the base 101, which extend from the outer wall to the edge of the connecting receptacle 105, forming a plurality of waterproof compartment 113 arrays with said first retaining block 109, hence, waterproof glue 115 would flow from a higher position into a lower position in waterproof compartment 113 during the process of injection, resulting to the uniformly distribution of said waterproof glue 115, increasing the adhesion in structure level with said waterproof glue 115 and waterproof compartment 113 to reach the purpose of raising the airtightness of the electrical connector 100. In one embodiment of the present invention, the first retaining block 109 and the second retaining block 111 are perpendicular to each other, further, in another embodiment, the numbers and the angle of lateral or longitudinal configuration could be adjusted with the application, such as simplification of the manufacturing process, cost of manufacture, the requirement level of international protection marking. For instance, the angle between the first retaining block 109 and the second retaining block 111 could be formed by radial arrangement along the outer wall of the base 101 (ie, the "米" shape or UK flag-like shape), to avoid the decrease of airtightness resulting from the air being concentrated in the unevenness during the process of encapsulating the upper lid 117 to the electrical connector 100, thereby causing the pressure distribution is even when the upper lid 117 is extruded against the base 101. In accordance with one aspect of the present invention, the angle of the first retaining block 109 and the second retaining block 111 could be perpendicular, the "米" shape (or UK flag-like shape), toroidal shape, or spiral shape which is based on the needs of the application.

In view of the above, the number of waterproof compartments would increase as the number of the first retaining block 109 and the second retaining block 111 are increasing, it's not only to prevent the air from concentrating at the unevenness location, but also raising the temperature variety tolerance of the electrical connector 100 due to ambient temperature, or the heat produced by the electrical cable 123, connecting wire, circuit board 125 during transmission of massive electrical power and signal. Since the presence of the waterproof compartment 113, when the electrical connector 100 encounters accident, or a part of the electrical connector 100 is damage to cause the airtightness failure due to the drastic temperature variation, the rest part of waterproof compartments could still perform well. In that case, the electrical connector 100 could be repaired or replaced to improve the reliability of the electrical connector 100.

In accordance with one embodiment, please refer to the FIG. 4B-FIG. 6, the connecting receptacle 105 is deposited on the upper end of the base 101, making connecting wire could couple to electrical connector 100 on the top end. The electrical cable 123 on the connecting unit 107 penetrates the inner side of the base 101 through the pore disposed on the base 101, and the connecting wire is coupled to the connecting unit 107 through the connecting receptacle 105 in the longitudinal direction. In the another embodiment, the connecting receptacle 105 is disposed on the side of the base 101, making connecting wire could couple to electrical connector 100 base on the needs of the application. Therefore, no matter the connecting receptacle 105 is disposed on the top end or in the side of base 101, the electrical cable 123 could be fixed firmly inside the electrical connector 100 after the injection of the waterproof glue 115, achieving the purpose of preventing the moisture or suspended particles from infiltrating into the electrical connector 100.

In accordance with one embodiment, please refer to the FIG. 5, the inner side of the housing 103 could be design base on demand, such as rectification, voltage transform, voltage regulator, or the modulation during transmission of electrical signals, it may include a circuit board 125, mounted inside the base 101, coupling the connecting unit 107 through the electrical cable 123. The circuit board 125 further couples to a plug 121 for transmitting the electrical power and electrical signal.

According to an embodiment of the present invention, the material of the waterproof glue 115 could be, but not limit to Silicone, Epoxy, Polyurethane, Butyl Rubber, Hypalon Polyethylene Rubber, Natural Rubber, Polyacrylate Rubber, Neoprene Rubber, or the combination of the above materials to enhance the lifetime of the device. In one embodiment of the present invention, the lifetime of the device would be 2000-15000 times according to the needs of application under the level of waterproof IPX3-IPX9, and dust-proof IP2X-IP6X. In addition, the present invention could meet the International Protection Marking standard of IPX3 or higher level under economical manufacturing cost, that is, the electrical connector 100 proposed by the present invention is sufficient to withstand water pressure 50-150 kPa, flowing rate 10 L/min, water flowing duration time for 10 minutes without equipment damage, also, the level of water protection could be raised to IPX9 which is based on the demand. In the embodiment of the present invention, the range of the airtightness is between the rough vacuum and medium vacuum (i.e., in the range of 10-750 torr).

The present invention provides a manufacturing method of electrical connector 100 with waterproof structure, comprising: assembling the connecting unit 107 to the connecting receptacle 105 on a base 101, wherein the base 101 is provided with first retaining block 109 and second retaining block 111; assembling and fixing one end of electrical cable 123 to the connecting unit 107, and the other end of said electrical cable 123 penetrated inside the base 101 through the pore mounted on the base 101; filling the waterproof glue 115 into the waterproof compartment 113 to form the first retaining block 109 and the second retaining block 111; ultrasonic welding is used to seal the components of the electrical connector 100, comprising welding the upper lid 117, the base 101, the connecting unit 107, and the housing 103 to prevent the moisture and suspended particles from infiltrating into the electrical connector 100.

According to the embodiment of the present invention, a manufacturing method of electrical connector 100 with waterproof structure as mentioned above further includes a steps of welding the circuit board 125 on the lower end under the base 101, and welding the electrical cable on the circuit board 125 to connect the circuit board 125 with the connecting unit 107. According to the other embodiment of the present invention, the circuit board 125 is welded on a plug 121 for transmitting electrical power or electrical signal.

According to the content of the present invention, the quantity of the waterproof glue 115 filled into the waterproof compartment 113, is the 60%-100% height between the edge forming on the base 101 of the housing 103 and the base 101 for adjusting the level of water and suspended particulate protection according to the needs of the application. In the preferred embodiment, the 60% of the waterproof 115 could lightweight the electrical connector 100 and optimize the effectiveness of water and suspended particulate protection.

According to an embodiment of the present invention, the material of the waterproof glue 115 could be, but not limit to Silicone, Epoxy, Polyurethane, Butyl Rubber, Hypalon Polyethylene Rubber, Natural Rubber, Polyacrylate Rubber, Neoprene Rubber, or the combination of the above materials.

As will be understood by persons skilled in the art, the foregoing preferred embodiment of the present invention illustrates the present invention rather than limiting the present invention. Having described the invention in connection with a preferred embodiment, modifications will be suggested to those skilled in the art. Thus, the invention is not to be limited to this embodiment, but rather the invention is intended to cover various modifications and similar arrangements included within the spirit and scope of the appended claims, the scope of which should be accorded the broadest interpretation, thereby encompassing all such modifications and similar structures. While the preferred embodiment of the invention has been illustrated and described, it will be appreciated that various changes can be made without departing from the spirit and scope of the invention.

What is claimed is:

1. An electrical connector with waterproof structure, comprising:
   a base;
   a connecting receptacle installed on said base, said connecting receptacle including a tong portion enclosed by an outer casing;
   a housing configured to enclose said base, and said connecting receptacle;
   a plurality of retaining blocks disposed between said connecting receptacle and an inner wall of said housing, partitioned into a plurality of waterproof compartments by said plurality of retaining blocks, wherein said plurality of waterproof compartments are filled with a waterproof glue; and an upper lid to seal said base to prevent moisture and particles from entering said electrical connector.

2. The electrical connector of claim 1, further comprising at least one electrical cable deposited on said connecting receptacle and penetrated inside said base.

3. The electrical connector of claim 2, further comprising a circuit board mounted inside said base, coupling said connecting receptacle through said at least one electrical cable.

4. The electrical connector of claim 1, wherein said waterproof glue includes Silicone, Epoxy, Polyurethane, Butyl Rubber, Hypalon Polyethylene Rubber, Natural Rubber, Polyacrylate Rubber, Neoprene Rubber, or the combination thereof.

5. An electrical connector with waterproof structure, comprising:
  a base;
  a connecting receptacle including a tong portion enclosed by an outer casing;
  a connecting unit having said connecting receptacle mounted on and said connecting unit been installed on said base;
  a housing configured to enclose said base, said connecting unit, and said connecting receptacle;
  a plurality of retaining blocks disposed between said connecting receptacle and an inner wall of said housing, partitioned into a plurality of waterproof compartments by said plurality of retaining blocks, wherein said plurality of waterproof compartments are filled with a waterproof glue; and
  an upper lid to seal said base to prevent moisture and particles from entering said electrical connector.

6. The electrical connector of claim 5, wherein a quantity of said waterproof glue filled into said plurality of waterproof compartments is 60% height between an edge forming on said base of said housing and said base.

7. The electrical connector of claim 5, further comprising at least one electrical cable deposited on said connecting receptacle and penetrated inside said base.

8. The electrical connector of claim 5, further comprising a circuit board mounted inside said base, coupling said connecting receptacle through said at least one electrical cable.

9. The electrical connector of claim 5, wherein said waterproof glue includes Silicone, Epoxy, Polyurethane, Butyl Rubber, Hypalon Polyethylene Rubber, Natural Rubber, Polyacrylate Rubber, Neoprene Rubber, or the combination thereof.

10. The electrical connector of claim 5, wherein a pair of guiding slots located at an inner wall of two corresponding retaining blocks of said plurality of retaining blocks and configured to guide said connecting receptacle installing on said base.

\* \* \* \* \*